United States Patent [19]

Huff et al.

[11] Patent Number: 4,980,637

[45] Date of Patent: Dec. 25, 1990

[54] FORCE DELIVERY SYSTEM FOR IMPROVED PRECISION MEMBRANE PROBE

[75] Inventors: Richard E. Huff, Belmont; Brian Leslie, Cupertino, both of Calif.

[73] Assignee: Hewlett-Packard Company, Palo Alto, Calif.

[21] Appl. No.: 249,481

[22] Filed: Sep. 23, 1988

Related U.S. Application Data

[63] Continuation of Ser. No. 162,763, Mar. 1, 1988.

[51] Int. Cl.5 .............................................. G01R 1/06
[52] U.S. Cl. ............................. 324/158 P; 324/158 F
[58] Field of Search ................ 324/158 P, 158 F, 72.5

[56] References Cited

U.S. PATENT DOCUMENTS 4,636,722  1/1987  Ardezzone ...................... 324/158 P
4,758,785  7/1988  Rath .................................. 324/158 P Primary Examiner—Reinhard J. Eisenzopf
Assistant Examiner—Edward Urban

[57] ABSTRACT

Disclosed is a test probe [10] for testing a test device [not shown], also known as a device under test, while precisely controlling the force exerted by the test probe [10] on the test device. Included is a translation ring [18] as well as a carrier [12] formed to have at least a first side and a second side. The support means [12] is coupled to the translation ring [18]. Also included is at least one flexure pivot [14] for delivering a force to a test device; the flexure pivot [14] is coupled to the first side of the carrier. A membrane [16] is coupled to the second side of the carrier. Finally, at least one signal contact bump [24] is mounted on the membrane [16] for communicating an electric current between the test probe [10] and the test device [not shown].

8 Claims, 1 Drawing Sheet

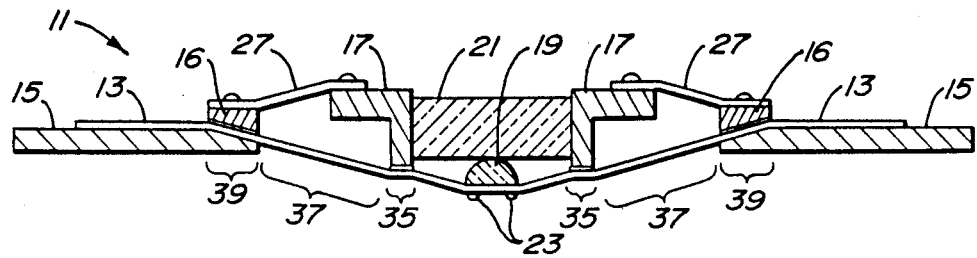
FIG._1.
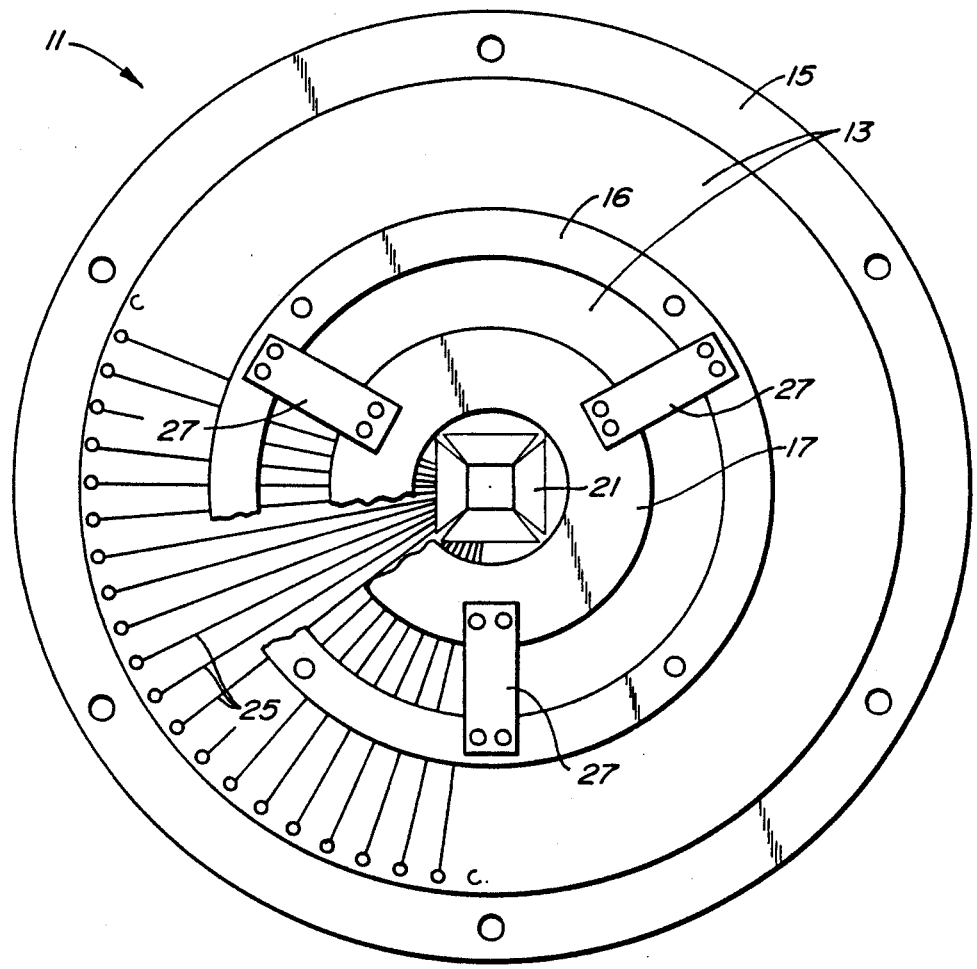
FIG._2.

FORCE DELIVERY SYSTEM FOR IMPROVED PRECISION MEMBRANE PROBE

CROSS-REFERENCE TO RELATED APPLICATION

This patent application is a Continuation application based on copending parent U.S. Patent Application Ser. No. 07/162,763, entitled "Membrane-Based IC Test Probe with Precisely Positioned Contacts" by Foster et al., filed Mar 11, 1988.

BACKGROUND TECHNOLOGY

This invention relates generally to the field of using test probes for integrated circuit testing of devices under test [DUT].

Nondestructive methods for testing integrated circuits are known to people skilled in the art of semiconductor fabrication. Integrated circuits are generally formed or grown layer by layer on chips identified on thin planar substrates called wafers. Before the wafer is cut into individual chips, the chip circuitry must be inspected and checked.

Test procedures are usually performed while the circuits still reside together on a single wafer, since testing after the dies have been sawn apart and packaged is prohibitively expensive. Hundreds of separate devices on every wafer are analyzed by passing input signals into each device and monitoring voltage levels at selected output locations on the tiny circuits.

Previous test methods use a moving needle-like probe that moves down and scans across the two planar dimensions of the substrate. Irrespective of whether the tester is guided to a particular input-output pad on the chip or the wafer is maneuvered under an axially guided probe, a limitation in the existing technology is that difficulty is encountered in controlling the compression force that is developed when the test probe touches its target DUT.

The circuit that is tested typically comprises many strata of conductive, insulative, and semiconductive materials. The force delivered by the probe must be kept within narrow predetermined limits. If the probe pushes too hard, the device under test can be severely damaged or the excessive wear caused by the immoderate compression and friction will contribute to the premature failure of the test probe.

The pressure of the contact must, however, exceed a threshold level so that an electrical connection is made to a conductive layer through the non-conducting lamina of oxide and contaminants that coat the top of the wafer.

Another limitation of currently available test systems is a tendency for faulty registration of the test probe on its target on the wafer. Probes that are disposed to wander or slide away from the desired target area on the chip after they make contact can seriously impair the authenticity of test results or damage the surrounding circuitry.

Each of these obstacles currently confronts engineers and technicians using conventional test equipment and each will prove more deleterious as integrated circuits become more complex. As the discrete components which they comprise shrink in size, it will become more difficult to precisely manipulate a fine, pin-like probe to place the probe at a microscopic destination on the face of a computer chip DUT.

The dual problems of (a) providing precise contact forces on the die DUT, and (b) constraining motion of the probe to translation along an axis that is perpendicular to the planar surface of the die DUT, each present a challenge to designers in the semiconductor business.

The development of an improved test probe which could overcome these critical impediments would represent a major technological advance in the field of integrated circuit fabrication. The enhanced levels of quality control and test reliability that could be achieved using such an innovative device would satisfy a long felt need within the industry and would enable chip manufacturers to save substantial expenditures of time and money.

The invention described here, and defined by the claims, offers a test probe for providing precisely controlled contact forces on an integrated circuit during a test procedure. Although the invention is primarily intended for use as part of an automated test system, this novel force delivery method and apparatus may be employed in any situation which requires a carefully guided placement of one or more electrical conductors on another.

SUMMARY OF THE INVENTION

This invention overcomes the previously encountered difficulty of precisely controlling the force delivered to an integrated circuit test device by a test probe. The invention may be used in conjunction with a conventional probe card held in a stationary chuck while a test wafer is stepped beneath the probe on a moving chuck.

The invention includes a disc-shaped translation stage which has a central aperture and which is coupled to a carrier through one or more flexure pivots. The pivots act as springs that control the vertical compression forces that the test probe imposes on the planar surface of a device under test.

The lower surface of the translation ring is attached to the same carrier by a flexible membrane bearing conductive contact bumps. A pattern of leads is formed on the membrane to convey electrical signals from the contact bumps to the probe card. Between the carrier and the translation ring, the membrane is held under relatively low tension. In contrast, the central portion of the membrane is stretched across the aperture of the translation stage.

The membrane restricts the lateral motion of the contacts which are mounted at its center. The low strain on the outer portion of the membrane minimizes the vertical resilience which the membrane would otherwise impart to the test probe. By eliminating this undesirable mechanical characteristic, the flexure pivots are allowed to control the compression forces that are ultimately applied to the device under test.

The number, size, shape, and constituent material of the pivots can be varied to suit particular test needs and conditions. This combination of compression and tension control constrain the movement of the translation disc so that it can only move in uniform rectilinear motion.

Since the movement of the translation stage is confined to motion in a direction parallel to itself, the entire probe is prevented from tilting or yawing which would seriously impair the precise registration of the contact bumps on the test device. A soft elastomer placed above the membrane and inside the translation ring cushions the force of the probe against a contact pad on a wafer.

A transparent window assembly suspended across the top of the ring allows the operator of the test equipment to align the probe card on the device under test.

This invention provides a reliable and accurate system for analyzing circuits on an integrated circuit that will enable engineers in the semiconductor industry to construct better and more economical test equipment.

BRIEF DESCRIPTION OF THE DRAWINGS

FIG. 1 is a cross-sectional view of an example construction according to the invention; and FIG. 2 shows a top view of an example construction according to the invention.

DETAILED DESCRIPTION OF EXAMPLE EMBODIMENTS

System Overview

The Claims define; the Drawings plus Detailed Description illustrate an example. The Claims broadly define the invention; the combination of the Drawings plus this Detailed Description presents a single example structure built according to the invention defined by the Claims. Of all the structures that can be made according to the Claims, the inventors consider this particular example structure to be the best structure or best mode for practicing the claimed invention.

FIG. 1 shows an overview of a sample construction according to the invention.

The invention defined by the appended Claims is a test probe [10]comprising: (a) a translation means [18]; (b) at least one compression means [14]for delivering force to a test device, the compression means [14]being coupled to a first side of a support means [12]; (c) a planar means [16]coupled to the support means [12], the planar means [16]being coupled to a second side of the support means [12]; and (d) at least one signal conduction means [24]mounted on the planar means [16]for conveying an electrical current from the test device into the test probe [10].

System Details

FIG. 1 shows a test probe 10 having a carrier 12 that supports a plurality of flexure pivots 14 and a membrane 16. Pivots 14 and membrane 16 are each coupled to an annular translation stage 18 having a central aperture 17. A transparent window 20 spans the top portion of the translation stage 18. The inner chamber within ring 18 contains an elastomeric cushion 22. A plurality of conductive contact bumps 24 have been pre-formed on the membrane 16. Each contact bump 24 is coupled to a conductive signal trace (not shown) which conveys electrical signals to and from a device under test (not shown) through the contact bump 24.

FIG. 2 shows a preferred construction using three flexure pivots 14. Any number of pivots may be used depending on the needs of particular test conditions. One continuous flexure pivot spanning the carrier 12 may also be used.

FIG. 1 also shows each pivot 14 comprising three distinct sections: a carrier overlap end 14a, a central section 14b, and a translation ring overlap end 14c. Similarly, membrane 16 comprises a carrier overlap portion 16a, an outer portion 16b, a translation ring overlap portion 16c, and an inner portion 16d that bears the contact bumps 24.

The outer portion of the membrane 16b is maintained under relatively low tension in comparison to inner portion 16d, which is stretched across the bottom of translation ring 18 and held taut under relatively high tension.

Region 26 between the contact bumps 24 may also contain patterns of conductors (not shown) which are employed to sense signals from a device under test. These lead patterns (not shown) also help to stabilize the inner portion of the membrane 16d and restrict its lateral motion.

Probe 10 is used in conjunction with a conventional probe card (not shown) that is held in a stationary chuck while a test wafer (not shown) is stepped beneath the probe on a moving chuck.

When the contact bumps are impressed upon the contact pads of a test device, a force directed perpendicular to the test device surface impinges upon a contact pad through the flexure pivots 14, translation ring 18, and elastomeric cushion 22 to bumps 24. This vertical force is precisely determined by the number, geometric configuration, size, and constituent material of pivots 14.

The vertical pressure is selected so that the force imposed on each contact bump is lower than the level of force which would damage the test device, but which is higher than the minimum degree of force which is necessary to penetrate the oxide layer that coats the contact pad of the integrated circuit which is being tested. Maintaining the compressive force below this upper limit reduces excessive wear on the bumps, avoids premature failure of the probe, and ensures reliable registration of the probe on the device under test.

Once the moving chuck reaches the end of its travel, the flexure pivots are fully deflected and the static contact force between the contact bumps and the wafer is maintained by the spring reaction of the pivots. The present invention has been successfully employed on test devices having from one to five hundred contact pads.

The variation in tension levels between the peripheral and central portions of membrane 16 endows the probe 10 with superior lateral motion control properties. Since the outer portion of the membrane 14b is loosely connected to carrier 12, the membrane does not act like a spring when the probe is pushed against a planar surface.

Only the innermost portion of the membrane 16d, which spans the central aperture 17 at the bottom of annular translation stage 18, is maintained under substantial tension. This deliberately imposed tension differential allows flexure pivots 14 to control the vertical forces of the contact bumps 24 against the contact pads of a test circuit. The slack in outer section 16b of membrane 16 does not impede the motion of the disc-shaped translation ring 18, which motion is controlled by the flexure pivots. This design prevents yawing or tilting of the lower portions of the probe, which might cause slippage and misalignment of the contact bumps 24 across the contact pads of a test device.

The soft elastomer 22 is bonded to membrane 16 to absorb some of the shock of the vertical force that is ultimately conveyed to the contact bumps 24. Transparent window 20 bridges the central aperture 17 of ring 18 and enables the operator of the probe 10 to align the probe 10 over the device under test.

Probe 10 is manufactured by first gluing the circumference of the membrane 16 to the carrier 12 without stretching the membrane so that it is loosely held within the circle of the carrier. In the preferred embodiment an insulating polyimide material was used for the membrane 16.

Contact bumps 24 are formed on the center of membrane 16 before the membrane is mated to ring 18 using a conventional laser milling technique to drill holes in the membrane; these holes are later plated with metal to form bumps 24. Their associated pattern of conductive signal traces (not shown) will have previously been formed on the flat membrane 16 using a well known photo-lithographic fabrication process.

Translation ring 18 is then glued to the central portion of the membrane 16d. During this step it is important to capture contact bumps 24 within the circular area bounded by the perimeter demarcated by the central aperture 17 of the translation stage 18. Once inner section 16d of the membrane is secured tightly across the aperture of disc 18, the entire assembly is heated. The elevated temperature allows translation ring 18 to be moved out of the plane of and away from carrier 12.

Membrane 16 is intentionally deformed to create a truncated cone shape based in the plane of the carrier 12 and membrane edges 16a, having inclined surfaces 16b a flattened section of the cone 16d. Flexure pivots 14, elastomer 22, and window 20 are then installed. In an alternative embodiment, a membrane material may be used which does not require heating before deformation.

The foregoing Detailed Description gives specific details illustrating how to practice the much more broadly claimed invention. However, people possessing ordinary skill in the art to which this invention pertains will appreciate that various modifications can be made without departing from the spirit and scope of the claims that follow.

Therefore it is to be understood that (a) the Detailed Description narrowly describes a single specific example construction made according to the Claims, whereas (b) the claims define an invention having a much broader scope, a scope which encompasses many other feasible specific example constructions in addition to the example given above.

The invention claimed is:

1. A test probe for testing a test device, the test probe comprising:
   (a) a translation means;
   (b) a support means, formed to have at least a first side and a second side, the support means being coupled to the translation means;
   (c) at least one compression means, formed for delivering a force to a test device, the compression means being coupled to the first side of the support means;
   (d) a planar means, coupled to the second side of the support means; and
   (e) at least one signal conducting means, mounted on the planar means, formed for communicating an electric current between the test probe and the test device.

2. The test probe defined in claim 1, further including: a cushioning means:
   (i) the compression means and the planar means being coupled to the cushioning means; and
   (ii) the cushioning means being substantially enclosed by the translation means.

3. The test probe defined in claim 1, further including: a window means:
   (i) formed for viewing the assembly of the test probe; and
   (ii) affixed to the translation means.

4. An improved precision membrane test probe, formed for testing a substantially planar test device, the probe comprising:
   (a) a translation stage;
   (b) at least one compression spring, positioned at a first location on the translation stage;
   (c) a flexible tension platform, formed with a first side and a second side, and positioned at a second location on the translation stage;
   (d) an annular support, positioned adjacent the compression spring and the platform; and
   (e) at least one electrical conductor, coupled to the tension platform, and formed for delivering an electrical signal between the test device and the probe.

5. The probe defined in claim 4, further comprising:
   (a) the first side being formed on the tension platform on a surface opposite from the second side;
   (b) a mechanical cushioning, coupled to the first side of the tension platform, formed to carry the compression spring and the tension platform; and
   (c) the electrical conductor being formed onto the second side of the tension platform.

6. The probe defined in claim 4, further comprising: an assembly window, mounted to the translation stage.

7. An improved precision membrane test probe, the probe comprising:
   (a) a plurality of flexure pivots;
   (b) a disc, defining within itself a longitudinal aperture, the disc being connected to each of the pivots;
   (c) a carrier, fastened to a peripheral area of a lower surface of each of the pivots;
   (d) a membrane, connected to the disc, the membrane comprising:
      (i) a first section, fastened to the carrier;
      (ii) a second section, formed to reside within the first section, the second section being held under relatively low tension between the carrier and the disc;
      (iii) a third section, formed to reside within the second section and fastened to the disc; and
      (iv) a fourth section, formed to reside within the third section, and stretched to be in relatively high tension across the longitudinal aperture of the disc;
   (e) a plurality of conductive contact bumps, formed on the fourth section of the membrane;
   (f) a transparent assembly window, attached to an upper surface of the disc; and
   (g) an elastomer, attached to the membrane and substantially enveloped by the membrane, the disc, and the window.

8. A method of fabricating an improved membrane precision test probe, the method comprising the steps of:
   (a) forming a plurality of conductive contact bumps on a thin flexible membrane;
   (b) attaching a circumferential portion of the membrane to a carrier so that the membrane is held under relatively slight tension;
   (c) attaching a translation ring overlap portion of the membrane to a bottom surface of an annular translation stage in which is defined an aperture so that:
      (i) the central portion of the membrane is held under relatively high tension; and
      (ii) the plurality of contact bumps is captured within a region bounded by the aperture;

(d) deforming the membrane by forcing the translation stage away from the carrier so the central portion of the membrane protrudes from the carrier, thus forming a generally truncated conical configuration;

(e) mounting at least one flexure pivot on the annular translation stage to provide precise control of compressive forces delivered through the contact bumps onto a device under test;

(f) attaching an elastomeric cushion to the membrane opposite the contact bumps; and (g) attaching a transparent window across a top surface of the translation stage.

* * * * *